United States Patent
Huebner (10) Patent No.: US 7,924,035 B2
(45) Date of Patent: Apr. 12, 2011

(54) PROBE CARD ASSEMBLY FOR ELECTRONIC DEVICE TESTING WITH DC TEST RESOURCE SHARING

(75) Inventor: Michael W. Huebner, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 188 days.

(21) Appl. No.: 12/173,711

(22) Filed: Jul. 15, 2008

(65) Prior Publication Data

US 2010/0013503 A1    Jan. 21, 2010

(51) Int. Cl.
*G01R 31/20* (2006.01)
(52) U.S. Cl. .............. 324/754.01; 324/754.03
(58) Field of Classification Search .......... None
See application file for complete search history.

(56) References Cited

U.S. PATENT DOCUMENTS

| | | | |
|---|---|---|---|
| 4,517,512 A | 5/1985 | Petrich et al. | |
| 4,746,855 A | 5/1988 | Wrinn | |
| 5,086,271 A | 2/1992 | Haill et al. | |
| 5,103,557 A | 4/1992 | Leedy | |
| 5,414,351 A | 5/1995 | Hsu et al. | |
| 5,491,427 A | 2/1996 | Ueno et al. | |
| 5,506,510 A | 4/1996 | Blumenau | |
| 5,539,325 A | 7/1996 | Rostoker et al. | |
| 5,559,444 A | 9/1996 | Farnworth et al. | |
| 5,629,137 A | 5/1997 | Leedy | |
| 5,648,661 A | 7/1997 | Rostoker et al. | |
| 5,701,666 A | 12/1997 | DeHaven et al. | |
| 5,736,850 A | 4/1998 | Legal | |
| 5,818,249 A | 10/1998 | Momohara | |
| 5,828,226 A | 10/1998 | Higgins et al. | |
| 5,838,163 A | 11/1998 | Rostoker et al. | |
| 6,022,750 A | 2/2000 | Akram et al. | |
| 6,064,948 A | 5/2000 | West et al. | |
| 6,158,030 A | 12/2000 | Reichle et al. | |
| 6,163,759 A | 12/2000 | Kita | |
| 6,181,144 B1 | 1/2001 | Hembree et al. | |
| 6,215,320 B1 | 4/2001 | Parrish | |
| 6,218,910 B1 | 4/2001 | Miller | |
| 6,300,757 B1 | 10/2001 | Janssen | |
| 6,327,678 B1 | 12/2001 | Nagai | |
| 6,339,338 B1 | 1/2002 | Eldridge et al. | |
| 6,351,134 B2 | 2/2002 | Leas et al. | |
| 6,400,173 B1 | 6/2002 | Shimizu et al. | |
| 6,476,630 B1 | 11/2002 | Whitten et al. | |
| 6,539,531 B2 | 3/2003 | Miller | |

(Continued)

FOREIGN PATENT DOCUMENTS

DE    19922907 A1    12/1999

(Continued)

OTHER PUBLICATIONS

PCT/US2009/049719: Int'l Search Report and Written Opinion (Jan. 4, 2010), 11 pages.

*Primary Examiner* — Vinh P Nguyen
(74) *Attorney, Agent, or Firm* — Kirton & McConkie (57) ABSTRACT

A test system can include contact elements for making electrical connections with test points of a DUT. The test system can also include a DC test resource and a signal router, which can be configured to switch a DC channel from the DC test resource between individual contact elements in a group of contact elements.

11 Claims, 9 Drawing Sheets

U.S. PATENT DOCUMENTS

| | | |
|---|---|---|
| 6,603,323 B1 | 8/2003 | Miller |
| 6,606,575 B2 | 8/2003 | Miller |
| 6,622,103 B1 | 9/2003 | Miller |
| 6,657,455 B2 * | 12/2003 | Eldridge et al. ............... 324/765 |
| 6,724,209 B1 | 4/2004 | Whitten et al. |
| 6,853,211 B2 | 2/2005 | Doherty et al. |
| 7,019,547 B2 * | 3/2006 | Aghaeepour ................. 324/765 |
| 7,078,927 B2 * | 7/2006 | Tanida et al. ................. 324/765 |
| 7,154,259 B2 | 12/2006 | Miller |
| 7,245,134 B2 | 7/2007 | Granicher et al. |
| 7,307,433 B2 | 12/2007 | Miller et al. |
| 7,609,080 B2 * | 10/2009 | Miller et al. .................. 324/765 |
| 2004/0148122 A1 | 7/2004 | Whitten et al. |
| 2006/0061374 A1 * | 3/2006 | Shinozaki et al. ............ 324/754 |
| 2007/0261009 A1 | 11/2007 | Granicher et al. |
| 2008/0054917 A1 | 3/2008 | Henson et al. |
| 2008/0061803 A1 | 3/2008 | Lane et al. |
| 2008/0136432 A1 | 6/2008 | Chraft et al. |

FOREIGN PATENT DOCUMENTS

| | | |
|---|---|---|
| EP | 0566823 A2 | 10/1993 |
| EP | 0919823 A2 | 6/1999 |
| JP | 11-101849 | 4/1999 |

* cited by examiner

PROBE CARD ASSEMBLY FOR ELECTRONIC DEVICE TESTING WITH DC TEST RESOURCE SHARING

BACKGROUND

Manufacturing an electronic device, such as a semiconductor die having integrated circuitry, can include testing the electronic device, which can be termed a device under test or "DUT." (As used herein, a DUT can be, by way of example and not limitation, any of the following: semiconductor dies unsingulated from a semiconductor wafer, singulated unpackaged semiconductor dies, singulated packaged semiconductor dies, an array or other arrangement of semiconductor dies (packaged or unpackaged) disposed in a carrier or other holding device, multi-die electronics modules, printed circuit boards, or the like, or combinations of the foregoing.) A typical testing system can include a tester and a probe card assembly. The probe card assembly can provide a physical interface to the DUTs by providing pressure contacts between probes of the probe card assembly and test points on the DUTs. The tester can control testing of the DUTs, for example, controlling the generation of stimulus signals applied to the DUTs and monitoring response signals produced by the DUTs. The signals can be provided to the DUTs through communications channels between the tester and the probe card assembly. Each channel can include circuitry configured to generate and/or drive a test signal to be input to a test point on a DUT and/or to monitor at that or another test point on the DUT an output signal produced by the DUT in response to the test signal. Each channel can be an AC channel or a DC channel.

It can be beneficial to test a number of DUTs in parallel. For example, parallel testing can provide higher throughput in the production process and/or test apparatus utilization. The trend to test increasing numbers of DUTs in parallel has resulted in ever increasing demands on the number of channels provided by a test system. In some cases, these demands have outpaced the growth in tester capacity. Moreover, providing an increase in the number of channels in a test system can be a significant cost factor.

Sharing of AC channels (see definition of AC channel below) has been implemented in some test systems by providing for fan out in the probe card assembly to distribute an AC test signal driven from an AC test resource in the tester to multiple DUTs. Unfortunately, these fan out schemes cannot be readily applied to share DC channels (see definition of DC channel below). Some embodiments of the present invention address utilizing one DC channel to provide test signals to and/or sense test signals from more than one test point on a DUT and/or more than one DUT.

SUMMARY

In some embodiments, a probe card assembly can include an electrical interface to DC channels to a tester, and the probe card assembly can include probes disposed to contact test points on an electronic device to be tested. The probe card assembly can also include a signal router configured to connect one of the DC channels to any probe in a group of the probes.

In some embodiments, a probe card assembly can include an electrical interface to DC channels to a tester. The probe card assembly can also include probes disposed to contact test points on an electronic device to be tested, and the probe card assembly can include a signal router, which can be configured to connect one of the DC channels to a group of the probes.

The probe card assembly can also include current sensors each of which can be configured to sense a level of current flowing between one of the probes in the group of probes and the DC channel.

In some embodiments, a test system can include contact elements for making electrical contact with test points of a DUT. The test system can also include a DC test resource and a signal router, which can be configured to switch a DC channel from the DC test resource between individual contact elements in a group of contact elements.

In some embodiments, a process can include bringing contact elements into contact with test points of an electronic device, and electrically connecting a DC test resource to one of the contact elements in a group of the contact elements. The process can further include performing a DC test on the electronic device by communicating a DC test signal from the DC test resource through the first contact element. The DC test resource can be switched to be connected to a different contact element in the group, which can occur while the contact elements remain in contact with the electronic device. A second DC test can then be performed on the electronic device by communicating a DC test signal from the DC test resource through the second contact element.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the figures can show simplified or partial views, and the dimensions of elements in the figures can be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, over, under, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, the terms "test signals," "DC test signal," "AC test signal," "DC channel," "AC channel," "DC test resource," and "AC test resource" have the following meanings:

- A "test signal" is a stimulus signal applied or to be applied to a DUT to test the DUT and/or a response signal generated by a DUT in response to a stimulus signal.
- A "DC test signal" is any of the following: (1) a static test signal (i.e., a signal that does not change substantially during a test cycle of a test performed on a DUT), (2) a test signal in any DC testing of a DUT including but not limited to open circuit testing, short circuit testing, leakage current testing, standby current testing, voltage trimming, and current trimming, or (3) an otherwise static test signal that may occasionally change value at a frequency of less than one megahertz.
- An "AC test signal" is non-static test signal (i.e., a test signal that changes substantially during a test cycle of testing of a DUT) that is not a DC test signal.
- A "DC test resource" is an electrical device configured to generate or receive DC test signals.
- An "AC test resource" is an electrical device configured to generate or receive AC test signals.
- A "DC channel" is a communications path for carrying a DC test signal to or from a DC test resource.
- An "AC channel" is a communications path for carrying an AC test signal to or from an AC test resource.

Figure 1:
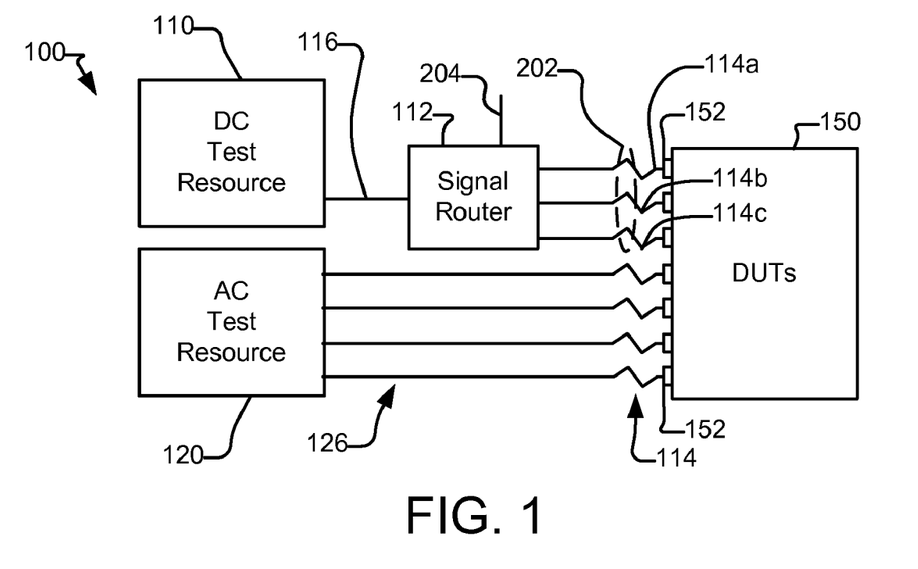
FIG. 1 is a schematic illustration of a test system in accordance with some embodiments of the invention.

FIG. 1 provides a schematic illustration of a test system 100 for testing a plurality of DUTs 150 in accordance with some embodiments of the invention. DUTs 150 in FIG. 1 can represent one or more actual DUTs. The test system 100 can include a DC test resource 110, which can be controlled by, for example, a tester (not shown) of test system 100. The DC test resource can, for example, comprise circuitry, a processor and computer program code stored in a memory, or the like for providing a DC test signal on a DC channel 116 to a DUT 150. Alternatively or in addition, the DC test resource 110 can monitor (e.g., sense) on a DC channel 116 a DC test signal generated by one of the DUTs 150. For example, the DC test resource 110 can be a signal source such as a voltage source configured to provide a DC test signal having a particular voltage on DC channel 116 or a current source configured to provide a DC test signal having a particular current on DC channel 116. As another example, the DC test resource 110 can be an electrical measurement device such as voltmeter or an ammeter. As yet another example, DC test resource 110 can be all or part of a DC measurement unit such as are commonly included in testers for controlling testing of semiconductor dies.

In some applications, a DC test signal can have significantly greater current requirements than comparable AC test signals. For this reason, DC channels can be configured to have the capacity to provide more current than comparable AC channels. Consequently, AC channels may not be capable of providing enough current needed for some DC test signals. Where DC test signals are used in particular tests, the number of DC channels 116 in a test system can thus limit the number of DUTs 150 that can be tested simultaneously or during one touch down of probes 114 on DUTs 150. Moreover, DC tests typically require delivery and/or measurement of test signals at precise voltage and/or current levels. Providing a DC test signal through the same DC channel 116 to multiple probes 114 (and thus multiple terminals 152 of DUTs 150) or measuring multiple DC test signals through the same DC channel 116 from multiple probes 114 (and thus multiple terminals 152 of DUTs 150), however, can reduce the precision of the delivered or measured current or voltage of the test signal(s). It has thus not been practical to provide a DC test resource (e.g., like 110) to more than one probe 114 and thus more than one terminal 152 of DUTs 150. As will be discussed, however, the DC test resource 110 of FIG. 1 can be provided to more than one probe 114 and thus to more than one of the DUTs 150 and/or more than one terminal 152 of the same one of the DUTs 150. By so doing, the number of the DUTs 150 that can be tested simultaneously or during one touch down of probes 114 on DUTs 150 with tests that involve DC test signals can be increased, which can reduce total test time and cost for testing DUTs 150.

Referring to FIG. 1, the DC test resource 110 can be electrically coupled by a DC channel 116 to a signal router 112, which can be electrically coupled to a group 202 (which can be a non-limiting example of a first group) of probes 114 (which can be non-limiting examples of contact elements configured to make electrical pressure contact). Probes 114 can be, for example, spring probes. In FIG. 1, group 202 is illustrated as including three probes 114a, 114b, and 114c, but group 202 can have more or fewer probes 114 (e.g., two, four, five, six, seven, eight, nine, ten, or more probes 114). The probes 114 can be configured to make electrical pressure connections with corresponding test points 152 (which can be non-limiting examples of electrical contacts) of the DUTs 150. Test points 152 can be, without limitation, bonding pads, terminals, or other electrical input and/or output structures. Moreover, although six test points 152 are shown, DUTs 150 can have more or fewer test points. While the schematic of FIG. 1 shows probes 114 as elongate elements (e.g., spring contact elements) and the test points 152 as planar elements (e.g., bond pads), the test system 100 is not so limited. For example, the probes 114 can alternately be contact pads configured to make contact with test points 152 that are elongate elements (e.g., spring contact elements). Various arrangements of probes 114 and corresponding test points 152 can be used in embodiments of the invention, some of which are described in further detail below.

The signal router 112 can provide a selectable connection between the DC channel 116 and a selected one of the probes 114a, 114b, or 114c in group 202. For example, the signal router 112 can include one or more switches or relays the positions of which can be controlled by control input 204, which can be controlled by, for example, a tester (not shown) of test system 100. For example, signal router 112 can comprise a single-throw multi-pole switch or relay. Signal router 112 can thus allow the DC channel 116—and thus the DC test resource 110—to be connected to and/or switched between any one of the probes 114a, 114b, or 114c in group 202. Moreover, each of probes 114a, 114b, and 114c can contact a test point 152 on a different DUT 150. Accordingly, during testing of the DUTs 150, the DC channel 116—and thus the DC test resource 110—can be selectively connected to any one of probes 114a, 114b, or 114c and thus to a test point 152 on any one of three different DUTs 152. Moreover, during testing, signal router 112 can switch between the probes 114a, 114b, and 114c at different times. Switching control input 204 can receive a signal for causing signal router 112 to switch selectively connection of DC channel 116 among probes 114a, 114b, and 114c.

While the non-limiting example in FIG. 1 illustrates a single DC test resource 110 with a single DC channel 116 connectable to any one of three probes 114a, 114b, and 114c, test system 100 is not so limited. For example, test system 100 can include a plurality of DC test resources 110 each of which can be connected through a DC channel 116 and a signal router 112 to a plurality of probes. As another example, more than one DC channel 116 can connect a DC test resource 110 to one or more signal routers 112, each of which can connect one of the DC channels 116 to more or fewer than three probes.

Figure 2:
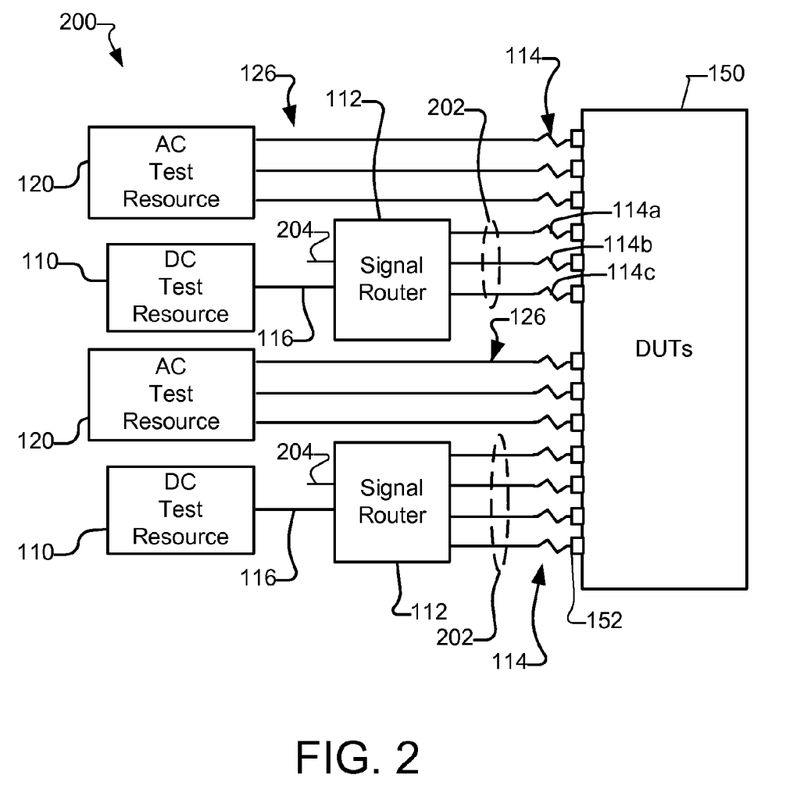
FIG. 2 is a schematic illustration of another configuration of a test system in accordance with some embodiments of the invention.

For example, FIG. 2 illustrates a test system 200 in accordance with some embodiments of the invention that can include a plurality of DC test resources 110 (which can be non-limiting examples of additional DC test resources), and each DC test resource 110 can be electrically coupled by a DC channel 116 to one of a plurality of signal routers 112 (which can be non-limiting examples of additional signal routers). (Although two are shown, system 200 can include more than two DC test resources 110 and/or more than two signal routers 112.) Each signal router 112 can be coupled to a group 202 (e.g., like probes 114a, 114b, and 114c) of the probes 114. For example, the groups 202 (which can be non-limiting examples of additional groups) of probes 114 can be non-overlapping subsets (as shown) or partially overlapping subsets (not shown) of the probes 114 configured to contact test points 152 of DUTs 150. As shown in FIG. 2, control of each signal router 112 can be provided through a control connection 204 from an external resource, such as a tester (not shown).

Referring again to FIG. 1, test system 100 can also include an AC test resource 120, and AC channels 126 can connect AC test resource 120 with ones of probes 114, which as shown, can make connections with ones of the test points 152 of DUTs 150. AC test resource 120 can comprise circuitry, a processor and computer program code stored in a memory, and/or the like for generating AC test signals in the form of, for example, test vectors, for testing the functional operation of DUTs 150. As shown in FIG. 2, test system 200 can include a plurality of AC test resources 120. (Although two are shown, test system 200 can include more than two AC test resources 120.)

Figure 3A:
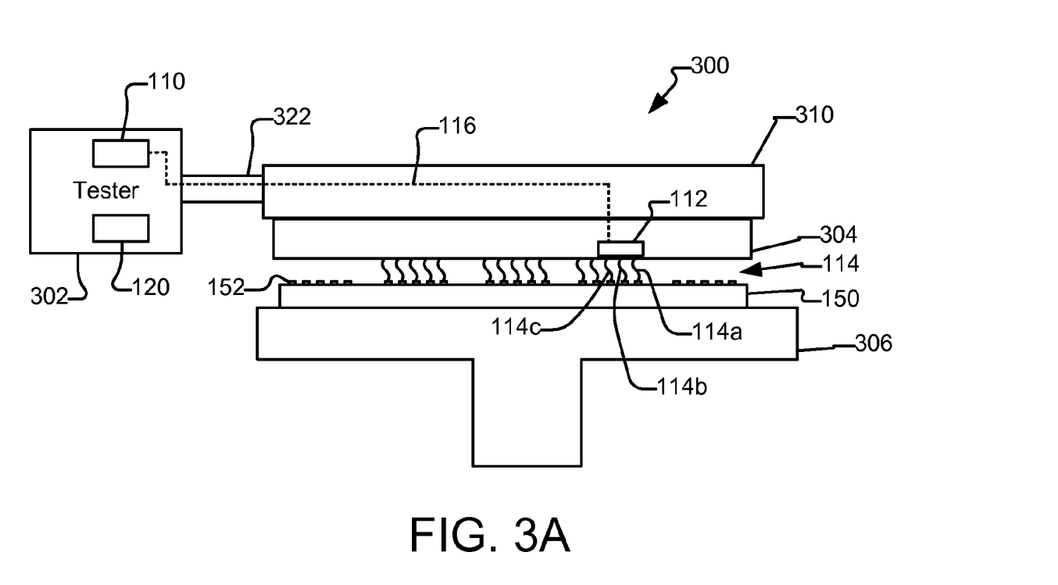
FIG. 3A is a schematic illustration of a test system in accordance with some embodiments of the invention.

Accordingly, the exemplary, non-limiting test systems 100 and 200 of FIGS. 1 and 2 can be used to switch selectively a single DC channel 116 from a DC test resource 110 between each probe of a group of probes (e.g., group 202 of probes 114a, 114b, and 114c). This can allow the DC test resource 110 to provide a DC test signal over a single DC channel 116 to multiple test points 152 (e.g., input pads or terminals) on the same DUT 150 or to test points 152 on multiple DUTs 152. Alternatively or in addition, the DC test resource 110 can sense DC test signals over a single DC channel 116 from multiple test points 152 on the same DUT 150 or test points 152 on multiple DUTs 152. There are many possible applications for test systems like test systems 100 and 200. FIG. 3A illustrates an example of such a test system.

FIG. 3A shows a non-limiting example of a probing test system 300 in accordance with some embodiments of the invention in which features have been simplified for ease of discussion and are not necessarily drawn to scale. For example, as mentioned, in some embodiments, DUTs 150 can be as earlier described, and probing test system 300 can be used to test such DUTs 150. As shown in FIG. 3A, the test system 300 can include a tester 302, a test head 310, a probe card assembly 304, and a stage 306 on which DUTs 150 can rest. The probe card assembly 304, the test head 310, and electrical connections 322 (e.g., cables or other data communication medium (e.g., wireless links)) can provide communications channels between probes 114 of the probe card assembly 304 and the tester 302, which as shown, can comprise one or more DC test resources 110 (one is shown but more can be provided) and one or more AC test resources 120 (one is shown but more can be provided). Moreover, the communications channels provided by probe card assembly 304, test head 310, and electrical connections 322 can include one or more DC channels 116 (one is shown but more can be provided), and although not shown, one or more AC channels (126 in FIGS. 1 and 2). As also shown, probe card assembly 304 can include one or more signal routers 112 (one is shown but more can be provided), which as illustrated in FIGS. 1 and 2, can switch one or more DC channels 116 between probes in a group (e.g., as shown in and discussed above with respect to FIG. 1). Although not shown in FIG. 1, tester 302 can provide (e.g., through a communication channel comprising electrical connections 322, test head 310, and probe card assembly 304) a control signal to control connection 204 (see FIGS. 1 and 2) to control signal router 112. Alternatively, a control signal can be provided to control connection 204 (see FIGS. 1 and 2) from a source other than tester 302.

FIG. 3A thus illustrates an exemplary test system 300 in which a DC test resource 110 and an AC test resource 120 can be implemented in a tester 302; DC channels and AC channels can be implemented in electrical connections 322, test head 310, and probe card assembly 304; and signal router 112 and probes 114 can be part of probe card assembly 304. Moreover, DUTs 150 can be disposed on a moveable stage 306 and moved such that test points 152 of one or more of DUTs 150 are brought into contact—and thus make electrical connections—with probes 114. In the probing test system 300 of FIG. 3A, a single DC channel 116 from DC test resource 112 can be switched between multiple probes 114 (e.g., probes 114a, 114b, and 114c) as generally discussed above with respect to and illustrated in FIG. 1. Although one DC test resource 110 and one signal router 112 is shown in FIG. 3A, tester 302 can comprise a plurality of DC test resources 110 and a plurality of signal routers 112 each of which can connect a selected one of a group of probes 114 to a DC channel 116 and thus to a DC test resource 110 as generally shown in the non-limiting example show in FIG. 2.

Tester 302 can comprise a computer programmed to control testing of DUTs 150. Test head 310 can comprise electrical paths and/or circuitry (e.g., driver circuitry, buffer circuitry, etc.) that electrically connect to electrical connections 322 and probe card assembly 304. Moreover, probe card assembly 304 can comprise an electrical interface to the test head that electrically connects to AC channels and DC channels formed by connections 322 and test head 310. In some embodiments, test head 310 need not be present, and probe card assembly 304 can connect directly to connections 322.

Figure 3B:
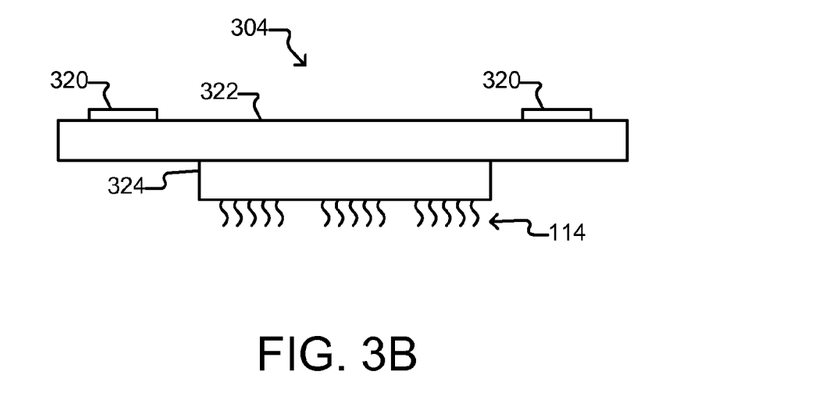
FIG. 3B illustrates an exemplary probe card assembly according to some embodiments of the invention.

For ease of illustration, the probe card assembly 304 is illustrated in FIG. 3A in simplified block diagram format. Probe card assembly 304 can take many forms and can, for example, comprise multiple interconnected substrates such as, for example, shown in FIG. 3B. As shown in FIG. 3B, probe card assembly 304 can comprise a wiring substrate 322 (e.g., a printed circuit board or other type of wiring board) and a probe head 324 (e.g., a multilayer ceramic material with embedded vias and traces) to which probes 114 can be attached. Wiring substrate 322 and probe head 324 can be electrically and mechanically connected to each other. Electrical connectors 320 (e.g., zero insertion force connectors, pogo pin pads, etc.) configured to make multiple electrical connections with test head 310 can be disposed on wiring substrate 322, and electrical connections (not shown) in the form of vias, traces, and/or pads (not shown) in and/or through wiring substrate 322 and probe head 324 can electrically connect the connectors 320 and the probes 114. Signal router 112 (or multiple signal routers 112) can be disposed on wiring substrate 322 or probe head 324. Moreover, a signal router 112 can be disposed in part on wiring substrate 322 and in part on probe head 324.

Probes 114 can be electrically conductive spring contact structures. Non-limiting examples of suitable probes 114 include composite structures formed of a core wire that is over coated with a resilient material as described in U.S. Pat. No. 5,476,211 . The probes 114 can alternatively be lithographically formed structures. Non-limiting examples of lithographically formed probe structures are disclosed in U.S. Pat. No. 6,482,013 or U.S. Pat. No. 6,255,126 . Alternatively, probes 114 can comprise carbon nanotubes or other materials. As still further alternatives, probes 114 can be pogo pins, buckling beam probes (e.g., cobra probes), and other types of probes. Also, regardless of probe type, the probe can have a tip that can be in the shape of a pyramid, truncated pyramid, blade, bump, or any other suitable shape. Non-limiting examples of various shapes and sizes of suitable probe tips are described in U.S. Pat. No. 6,441,315 and U.S. Patent Application Publication No. 2007/0259456 .

The probing test system 300 of FIG. 3A is exemplary only, and many variations are possible. For example, although DC test resource 110 and AC test resource 120 are illustrated in FIG. 3A as part of tester 302, all or portions of AC test resource 120 and/or DC test resource 110 can alternatively be disposed in the test head 310, probe card assembly 304, and/or other intermediate assemblies (not shown). As another example, one or more DC test resources 110 can be disposed on the probe card assembly 304. For example, DC test resource 110 in FIG. 3A can be on probe card assembly 304 rather than in tester 302. For example, DC test resource 110 can be disposed, in whole or in part, on one or both of wiring substrate 322 and/or probe head 324 of the probe card assembly 304 shown in FIG. 3B. As yet another example, more than one signal router 112 can be disposed on probe card assembly 304. For example, DC channel 116 (which can be a non-limiting example of a first DC channel) can connect to a signal router 112 (a non-limiting example of a first signal router) as shown in FIG. 3A, and one or more additional DC channels (like DC channel 116 shown in FIG. 3A) (which can be a non-limiting example of a second DC channel) can connect to one or more additional signal routers (like signal router 112 shown in FIG. 3A) (which can be a non-limiting example of a second signal router.

Figure 4:
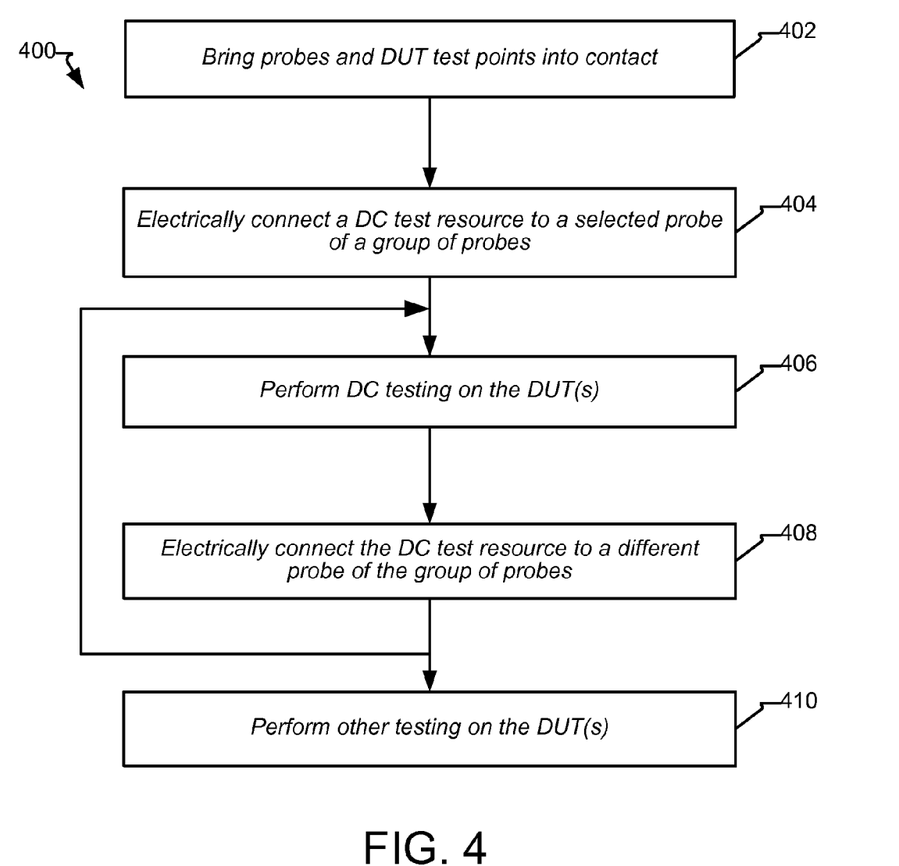
FIG. 4 is a flow chart diagram of a method of testing DUTs in accordance with some embodiments of the invention.

FIG. 4 illustrates an exemplary process for testing DUTs like DUTs 150 using a testing system like testing systems 100, 200, or 300. Although the following discusses process 400 with respect to probing system 300, process 400 can alternatively be used with other testing systems including testing system 100 or 200 or other testing systems that incorporate a testing system like 100 or 200.

The process 400 can include bringing at 402 probes 114 and contact points 152 of DUTs 150 into contact with each other. For example, DUTs 150 can be placed on stage 306 in FIG. 3A and moved such that ones of contact points 152 contact ones of probes 114. This can create pressure based electrical connections between the probes 114 and the contact points 152 of DUTs 150.

Figure 5:
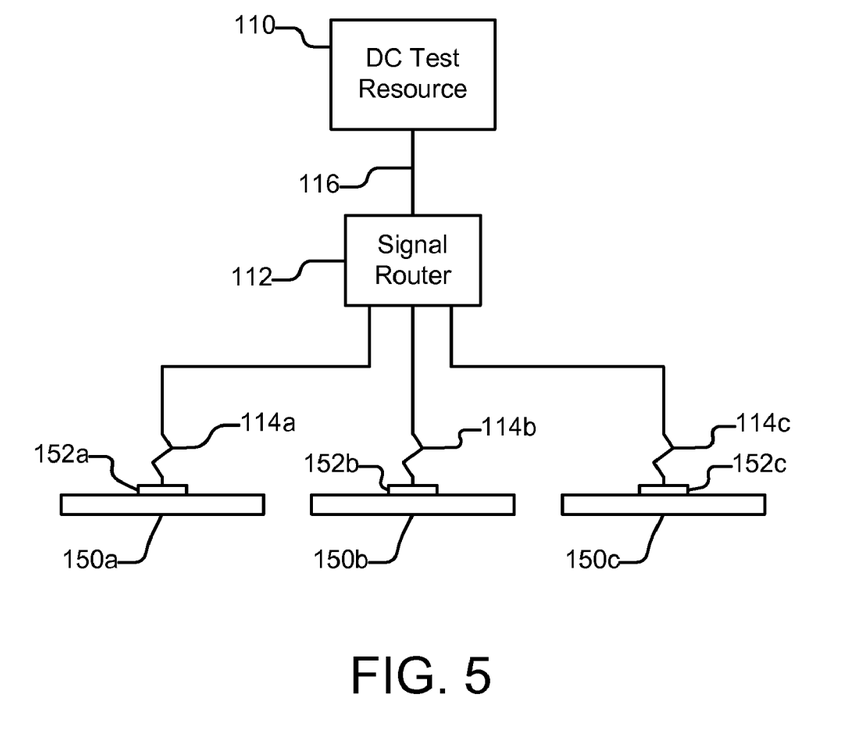
FIG. 5 illustrates an exemplary arrangement of a DC test resource, a signal router, and probes according to some embodiments of the invention.

The process 400 can also include controlling at 404 signal router 112 to electrically connect a DC channel 116 from a DC test resource 110 to a selected one of the probes 114. FIG. 5 illustrates probes 114a, 114b, and 114c shown in FIGS. 1-3 in contact, respectively, with contact points 152a, 152b, and 152c of individual DUTs 150a, 150b, and 150c, which can be ones of DUTs 150 in FIGS. 1-3. Alternatively, contact points 152a, 152, and 152c can be on the same DUT (e.g., DUT 150a). At 404, for example, signal router 112 can be set to connect DC channel 116 to probe 114a. (Probe 114a can be a non-limiting example of a first contact element, and probe 114b can be a non-limiting example of a second contact element.)

Referring again to FIG. 4, at 406, DC testing can be performed on DUT 150a (which can be a non-limiting example of performing a first DC test). DC testing can comprise DC test resource 110 providing DC test signals to DUT 150a and/or sensing DC test signals generated by DUT 150a through probe 114a and DC channel 116 (see FIG. 5). Non-limiting examples of DC testing that can be performed at 406 include open circuit testing, short circuit testing, leakage current testing, and standby current testing.

Another non-limiting example of DC testing that can be performed at 406 includes voltage trimming or current trimming non-limiting examples of which are as follows. Some DUTs include voltage or current trimming pads, which can be used in trimming a DUT for best or optimal performance. A trimming voltage or current can be applied to the voltage trimming pad. The DUT can then be operated and its performance can be monitored. The trimming voltage or current can then be varied to determine the trimming voltage or current that results in best or optimal performance or operation of the DUT. A process can then be used to program an on-DUT generator to generate the same or substantially the same voltage or current as identified during the voltage or current trimming operation.

At 406 of FIG. 4, the trimming of DUT 150a can proceed as will now be described with regard to FIG. 5. As shown in FIG. 5, probe 114a can be in contact with test point 152a of DUT 150a, and in this example, test point 152a can be a voltage or current trimming pad. At 406, DC test resource 110 can provide a trimming voltage or current signal (which can be a non-limiting example of a DC test signal) through DC channel 116 and signal router 112 to probe 114a and thus test point 152a of DUT 150a. DC test resource 110 can vary the trimming voltage or current signal while DUT 150a is exercised and its operation monitored. For example, AC test resource 120 in the tester 302 of the system 300 in FIG. 3A can exercise DUT 150a, monitor operation of DUT 150a, and determine when DUT 150a is operating best or optimally. Internal circuitry within DUT 150a can then be set so that the value of the trimming voltage or current that resulted in best or approximately best operation of DUT 150a is permanently supplied to test point 152a.

Referring again to FIG. 4, the process 400 can also include controlling at 408 the signal router 112 to electrically connect (or switch) the DC channel 116 from the DC test resource 110 to different one of the probes 114a, 114b, and 114c. At 408, for example, signal router 112 can be set to connect DC channel 116 to probe 114b.

As shown, 406 can then be repeated (which can be a non-limiting example of a second DC test). For example, the same DC test as previously performed at 406 on DUT 150a of FIG. 5 can now be performed on DUT 150b. Then, at 408, the signal router 112 can again be changed this time to electrically connect the DC channel 116 from the DC test resource 110 to a different one of the probes 114a, 114b, and 114c. Still referring to FIG. 4, 406 and 408 of process 400 can be repeated as needed to perform the DC testing on additional DUTs 150 in contact with probes 114 connected to signal router 112. For example, at 406, signal router 112 can be set to connect DC channel 116 to probe 114c, and 408 can again be repeated, for example, by performing the same DC testing at 408 on DUT 150c. (See FIG. 5.)

At 410 of FIG. 4, additional testing can be performed on DUTs 150. For example, additional DC testing can be performed on DUTs 150. In addition or alternatively, AC testing or functional testing can be performed on DUTs 150 at 410.

Figure 6:
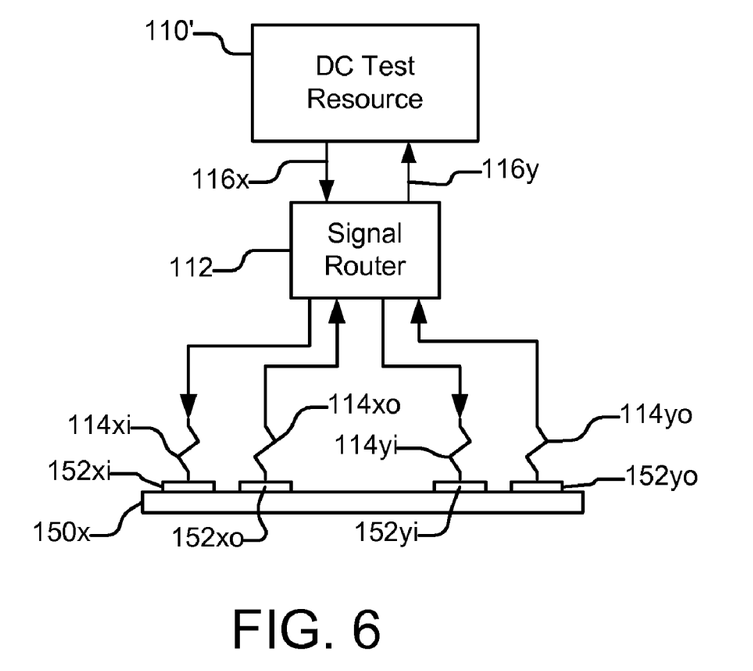
FIG. 6 illustrates another exemplary arrangement of a DC test resource, a signal router, and probes according to some embodiments of the invention.

The example shown in FIG. 5 is exemplary only and many variations are possible. For example, signal router 112 can connect DC channel 116 to more or fewer than three probes. As another example, test points 152a, 152b, and 152c can be on the same DUT rather than different DUTs 150a, 150b, and 150c as shown in FIG. 5. As yet another example, multiple probes (e.g., like probe 114a, 114b, and 114c) can contact multiple test points (e.g., like test points 152a, 152b, and 152c) on the same DUT (e.g., like DUTs 150a, 150b, and 150c). As still further examples, probes (e.g., like probe 114a, 114b, and 114c) can be configured alternatively or additionally to sense DC test signals. FIG. 6 illustrates a non-limiting example illustrating some of the foregoing variations.

As shown in FIG. 6, a DC test resource 110' can have a force DC channel 116x and a sense DC channel 116y, and a signal router 112 can connect the foregoing DC channels to multiple force probes and multiple sense probes. (FIG. 6 can be part of test systems 100, 200, and 300 or similar test systems.) A force DC channel 116x can be a channel through which a voltage or a current can be provided to DUTs 150, and a sense DC channel 116y can be a channel through which the other of a voltage or current resulting from the voltage or current provided through the force DC channel 116x can be sensed. For example, as shown in FIG. 6, signal router 112 can switch force DC channel 116x between force probes 114xi and 114yi, and signal router 112 can switch sense DC channel 116y between sense probes 114xo and 114yo. Thus, for example, signal router 112 can be set to connect force DC channel 116x to force probe 114xi and connect sense DC channel 116y to sense probe 114xo. (The foregoing can be an exemplary implementation of 404 of FIG. 4.) DC test resource 110' can then perform DC testing on DUT 150x by forcing a DC test signal (which can be a non-limiting example of a first DC test signal) through force channel 116x and force probe 114xi into test point 152xi on a DUT 150x. DC test resource 110' can then sense through sense probe 114xo and sense DC channel 116y a DC test signal (which can be a non-limiting example of a second DC test signal) generated by DUT 150x. (The foregoing can be an exemplary implementation of 406 of FIG. 4.)

Signal router 112 can then be set to connect (or switch) force DC channel 116x to force probe 114yi and connect sense DC channel 116y to sense probe 114yo. (The foregoing can be an exemplary repetition of 404 of FIG. 4.) DC test resource 110' can then perform further DC testing on DUT 150x by forcing a DC test signal (which can be a non-limiting example of a third DC test signal) through force channel 116x and force probe 114yi into test point 152yi on a DUT 150x. DC test resource 110' can then sense through sense probe 114yo and sense DC channel 116y a DC test signal (which can be a non-limiting example of a fourth DC test signal) generated by DUT 150x. (The foregoing can be an exemplary repetition of 406 of FIG. 4.) Of course, test points 152xi and 152xo can be on one DUT (e.g., DUT 150a in FIG. 5), and test points 152yi and 152yo can be on a different DUT (e.g., DUT 150b in FIG. 5). (Probe 114xi can be a non-limiting example of a first contact element; probe 114yi can be a non-limiting example of a second contact element; probe 114xo can be a non-limiting example of a third contact element; and probe 114yo can be a non-limiting example of a fourth contact element.)

Figure 7:
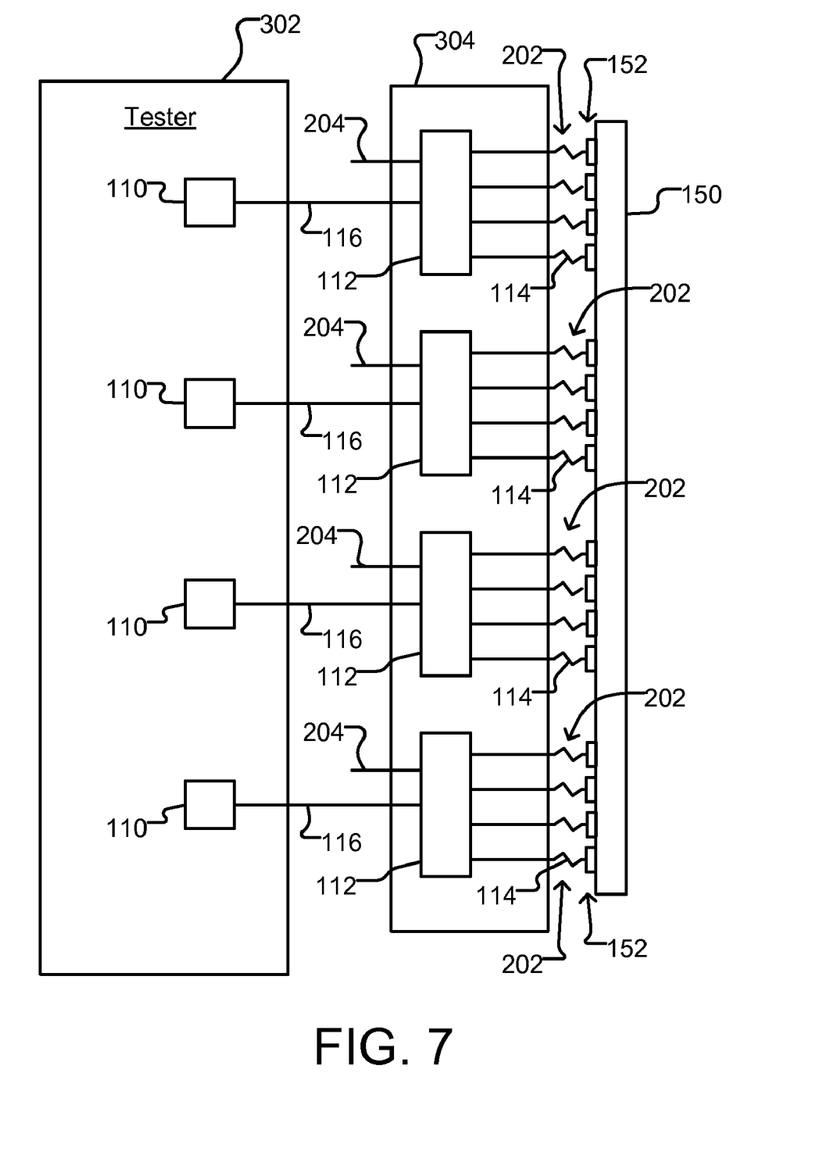
FIG. 7 illustrates a exemplary simplified configuration of the test system of FIG. 3A according to some embodiments of the invention.

FIG. 7 illustrates a simplified exemplary configuration of the test system 300 of FIG. 3A according to some embodiments of the invention. As shown, in the configuration shown in FIG. 7, tester 302 can include a plurality of DC test resources 110 (four are shown but fewer or more can be used). Although not shown, tester 302 can also have one or more AC tester resources (not shown) (e.g., like AC tester resource 120 of FIG. 1), which can also be provided to DUTs 150 (e.g., through AC channels 126 (see FIG. 1)). As shown, each DC test resource 110 can be connected to a DC channel 116, which can be connected through a signal router 112 to a group 202 of probes 114 of a probe card assembly 304 generally as described above. The probes 114 can contact and thereby make electrical connections with terminals 152 of DUTs 150, which can be supported on a stage 306 as shown in FIG. 3A. Signal router 112 can be controlled by one or more control inputs 204, which can be controlled by tester 302 and/or other equipment (not shown).

The configuration shown in FIG. 7 is exemplary only, and many variations are possible. For example, as stated above, fewer or more than four DC test resources 110 can be used, and AC test resources (not shown) can be included. Moreover, probe groups 202 can include fewer or more than four probes 114. For example, where the signal on channel 116 is a high current signal, fewer (e.g., two) probes 114 can be in a group 202. As another example, all or part of one or more of DC test resources 110 can alternatively be located on probe card assembly 304.

The probes 114 in a probe group 202 can each contact a terminal 152 of a different one of the DUTs 150 (as discussed above, 150 can represent more than one DUT), each of which can be, for example, a semiconductor die. Alternatively, two or more (including all) of the probes 114 in a group 202 can contact terminals on a same one of the DUTs 150. Tester 302 can run on the DUTs 150 contacted by probes 114 any of the DC tests discussed above as well as other tests, including AC or mixed DC and AC tests.

Figure 8:
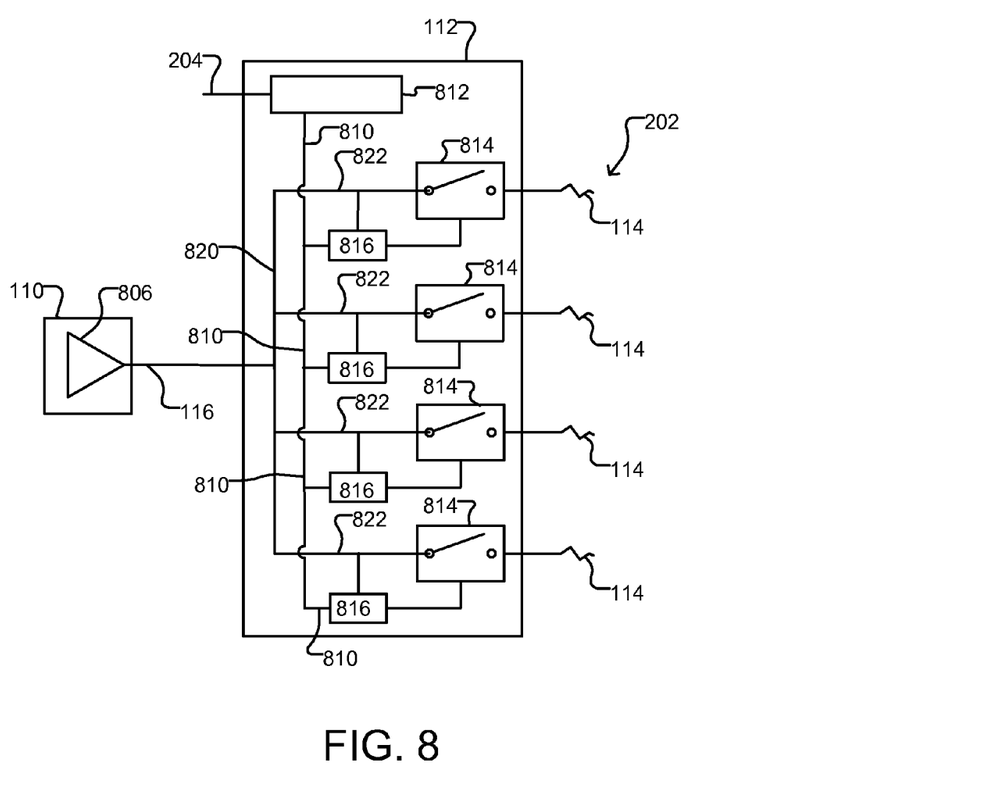
FIG. 8 illustrates an exemplary implementation of a signal router of the test system of FIG. 7 according to some embodiments of the invention.
Figure 9:
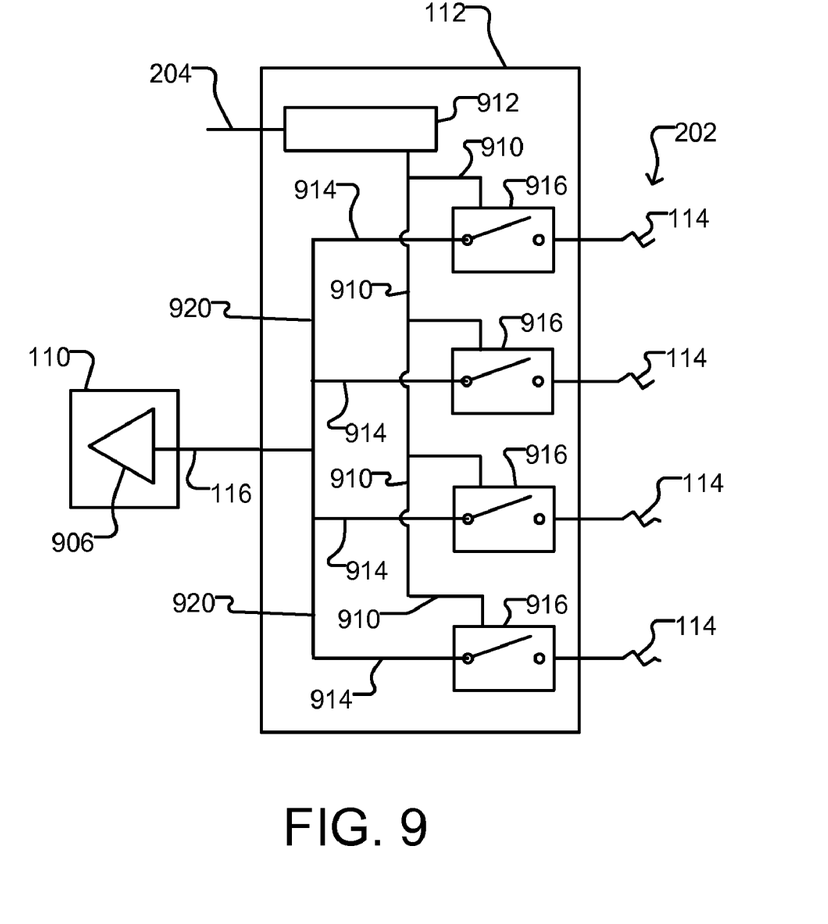
FIG. 9 illustrates another exemplary implementation of a signal router of the test system of FIG. 7 according to some embodiments of the invention.

Signal routers 112 can be implemented in a variety of configurations. FIGS. 8 and 9 illustrate two non-limiting implementations of one or more of signal routers 112 according to some embodiments of the invention.

In the exemplary configuration illustrated in FIG. 8, a DC test resource 110 can include a current driver 806, which can drive a DC signal in the form of a current down DC channel 116. As shown, signal router 112 can include a common line 820 that connects the channel 116 to branches 822, each of which can be connected through a switch 814 to a probe 114. Common line 820 and branches 822 can comprise trances, vias, wires, and/or other electrically conductive structures on or in probe card assembly 304. Switches 814 can be any type of electrical switch including without limitation single pole switches, magnetic relay switches, solid state switches, or micro-electro-mechanical system (MEMS) switches (e.g., like MEMS switches disclosed in U.S. patent application Ser. No. 12/106,364 (without or without scrubbing or wiping)). In operation, switches 814 can be closed, so that the DC signal driven by current driver 806 down DC channel 116 can be provided through each of switches 814 to all of probes 114. As shown in FIG. 8, signal router 112 can include current sensors 816 each of which can monitor the current level in a branch 822 and open the switch 814 to which the branch is connected if the current in the branch 822 exceeds a predetermined current threshold. Each sensor 816 can include a memory (not shown) that stores a code that sets the current threshold for the sensor 816. The current threshold can be preset during manufacture of probe card assembly 304 (see FIG. 7) and/or later programmed (or reprogrammed). For example, a controller 812 (e.g., a microprocessor or other electronic controller) can write a code or a new code to the memory (not shown) in each sensor 816 that sets the current threshold to a value that corresponds to the code. Controller 812 can write such a code to sensors 816 through connections 810 (which can be traces, vias, wires, or other electrical structures on or in probe card assembly 304). Controller 812 can thus program the current threshold of each sensor 816.

Controller 812 can alternatively or in addition control (e.g., open and close) switches 814 directly through connections 810 and sensors 816 or through a direct connection (not shown) to switches 814. Controller 812 can control signal router 112. Alternatively or in addition, controller 812 can be controlled by signals received through input 204, which as discussed above, can be connected to tester 302 and/or other equipment (not shown). In some embodiments, signal router 112 can be implemented as circuitry on a semiconductor die. For example, signal router 112 can be configured like the integrated circuit (IC) 300 illustrated in FIG. 3A of U.S. patent application Ser. No. 11/862,751, which is incorporated herein in its entirety by reference.

Configured as shown in FIG. 8, tester 302 (see FIG. 7) can provide a DC signal (driven by DC test resource 806) from one DC channel 116 through multiple probes 114 in a probe group 202 to multiple terminals 152 of one or more of the DUTs 150 (see FIG. 7). The current sensors 816 and switches 814 can provide protection against a fault (e.g., a short to ground or other type of fault) at or affecting one of the terminals 152 contacted by one of the probes 114 in the group 202. For example, a fault in which a terminal 152 is electrically connected to ground can cause an increase in current through the branch 822 connected to the terminal 152. Sensor 816 can detect the increase in current and open the corresponding switch 814, which can isolate the other probes 114 in the group 202, and thus the other DUTs 150 to which the other probes 114 are connected, from the fault. Rather than or in addition to a switch 814 being opened upon detection of a fault, controller 812 can send a notification to tester 302 or other equipment (not shown) that a fault was detected.

FIG. 9 illustrates another non-limiting exemplary implementation of signal router 112 according to some embodiments of the invention. In the exemplary implementation illustrated in FIG. 9, a DC test resource 110 can include a signal sensor 906 configured to sense a signal (e.g., a voltage or a current) output by one of the DUTs 150 through a terminal 152, a probe 114 in contact with the terminal 152, and signal router 112 to DC channel 116. As shown in FIG. 9, signal router 112 can include switches 916 (which can be like switches 816) through which each probe 114 in a probe group 202 can be connected to a branch 914, each of which can be connected by common line 920 to DC channel 116. (Branches 914 and common line 920 can be like branches 814 and common line 820 in FIG. 8.) A controller 912 (which can be like controller 812) can control (e.g., can open and close) switches 916 through connections 910 (which can be like connections 810). In operation, switches 916 can initially be open, and each switch 916 can sequentially be closed while the other switches 916 are open. In this way, a DC signal output at a plurality of terminals 152 contacted by the probes 114 of a probe group 202 can, one at a time, be provided through signal router 112 to DC channel 116 and sensor 906. In some embodiments, signal router 112 of FIG. 9 can be implemented as circuitry on a semiconductor die.

The implementations of signal router 112 shown in FIGS. 8 and 9 are exemplary only, and many variations are possible. For example, signal sensor 906 (e.g., a circuit for sensing the level of a voltage and/or a current on channel 116) can be replaced in FIG. 9 with a driver (e.g., a current driver like current driver 806 in FIG. 8 or a voltage driver) for driving a signal (e.g., in the form of a current and/or a voltage) down DC channel 116 through signal router 112 to probes 114 of a probe group 202. Switches 916 can be controlled as described above with respect to FIG. 9 so that the signal driven down DC channel can be sequentially provided one at a time to each of the terminals 152 contacted by the probes 114 of the probe group 202.

One or more of the DC test resources 110 and corresponding signal routers 112 in FIG. 7 can be configured as illustrated in FIG. 8. One or more of the DC test resources 110 and corresponding signal routers 112 can alternatively be configured as illustrated in FIG. 9 or in accordance with the modification in which signal sensor 906 is replaced with a signal driver (not shown). In fact, one or more of the DC test resources 110 and corresponding signal routers 112 in FIG. 7 can be configured as illustrated in FIG. 8, and others of the DC test resources 110 and corresponding signal routers 112 can be configured as illustrated in FIG. 8 or in accordance with the above discuss modification. The test system of FIG. 7 can thus include test resources 110 and corresponding signal routers 112 as shown in FIG. 8; other test resources 110 and corresponding signal routers 112 as shown in FIG. 9; and/or other test resources 110 and corresponding signal routers 112 in accordance with the above-discussed modification to FIG. 9.

As discussed above, probe card assembly 304 can comprise multiple substrates, such as wiring substrate 322 and probe head 324 shown in FIG. 3B, and signal router 112 can be disposed on wiring substrate 322 or probe head 324, or signal router 112 can be disposed in part on wiring substrate 322 and in part on probe head 324. Thus, controller 812, sensors 816, and/or switches 814 can be disposed on wiring substrate 322 or probe head 324 or distributed between wiring substrate 322 and probe head 324. Control input 204, common line 820, branches 822, and/or connection 810 can likewise be on wiring substrate 322 or probe head 324 and/or can provide electrical connections between wiring substrate 322 and probe head 324. Similarly, controller 912 and/or switches 916 can be disposed on wiring substrate 322 or probe head 324 or distributed between wiring substrate 322 and probe head 324. Control input 204, common line 920, branches 914, and/or connection 910 can likewise be on wiring substrate 322 or probe head 324 and/or can provide electrical connections between wiring substrate 322 and probe head 324.

Although specific embodiments and applications of the invention have been described in this specification, there is no intention that the invention be limited these exemplary embodiments and applications or to the manner in which the exemplary embodiments and applications operate or are described herein. For example, particular exemplary test systems have been disclosed, but it will be apparent that the inventive concepts described above can apply equally to alternate arrangements of a test system. Moreover, while specific exemplary processes for testing an electronic device have been disclosed, variations in the order of the processing steps, substitution of alternate processing steps, elimination of some processing steps, or combinations of multiple processing steps that do not depart from the inventive concepts are contemplated. Accordingly, it is not intended that the invention be limited except as by the claims set forth below.

What is claimed is:

1. A probe card assembly comprising:
   an electrical interface to a plurality of DC channels to a tester;
   a plurality of probes disposed to contact directly test points on one or more electronic devices to be tested; and
   a first signal router configured to switch selectively connection of a first one of the DC channels among each one of a plurality of first ones of the probes, wherein the signal router can connect the first DC channel to each one of first probes without simultaneously connecting the first DC channel to the others of the first probes.

2. The probe card assembly of claim 1, wherein the electrical interface is also to a plurality of AC channels to the tester.

3. The probe card assembly of claim 2 further comprising a plurality of electrical paths through the probe card assembly connecting ones of the AC channels to a plurality of second ones of the probes.

4. The probe card assembly of claim 3 further comprising a second signal router configured to switch selectively connection of a second one of the DC channels among each one of a plurality of third ones of the probes, wherein the second signal router can connect the second DC channel to each one of third probes without simultaneously connecting the second DC channel to the others of the third probes.

5. The probe card assembly of claim 1, wherein:
   the probes are disposed in a pattern that corresponds to the test points on a plurality of the electronic devices, and
   each of the first probes is disposed in the pattern to correspond to a different one of the electronic devices.

6. The probe card assembly of claim 1, wherein:
   the first signal router comprises a control input, and the first signal router is further configured to switch the connection of the first DC channel from one of the first probes to another of the first probes in response to a signal on the control input.

7. A probe card assembly comprising:
   an electrical interface to a plurality of DC channels to a tester;
   a plurality of probes disposed to contact directly test points on one or more electronic devices to be tested;
   a signal router configured to connect one of the DC channels through a plurality of switches to each of the probes in a group of a plurality of the probes wherein the signal router can disconnect the one of the DC channels from one of the probes in the group of the probes without simultaneously disconnecting the one of the DC channels from the other of the probes in the group of the probes;
   a plurality of current sensors each configured to sense a level of current flowing between one of the probes in the group of probes and the DC channel.

8. The probe card assembly of claim 7, wherein each of the current sensors is further configured to open a switch between the one of the probes in the group and the DC channel if the sensed current exceeds a predetermined current level.

9. The probe card assembly of claim 8 further comprising a controller configured to program selectively the predetermined current level.

10. The probe card assembly of claim 8, wherein the predetermined current level corresponds to an anticipated fault at one of the test points.

11. The probe card assembly of claim 10, wherein the anticipated fault is a short of the one of the test point to ground.

* * * * *